(12) United States Patent
Trester et al.

(10) Patent No.: US 11,177,210 B2
(45) Date of Patent: Nov. 16, 2021

(54) INTEGRATED CIRCUIT WITH NON-FUNCTIONAL STRUCTURES

(71) Applicant: NXP B.V., Eindhoven (NL)

(72) Inventors: Sven Trester, Graz (AT); Tobias Richard Erich Nink, Hamburg (DE)

(73) Assignee: NXP B.V., Eindhoven (NL)

( * ) Notice: Subject to any disclaimer, the term of this patent is extended or adjusted under 35 U.S.C. 154(b) by 9 days.

(21) Appl. No.: 16/731,522

(22) Filed: Dec. 31, 2019

(65) Prior Publication Data

US 2021/0202379 A1 Jul. 1, 2021

(51) Int. Cl.
| | |
|---|---|
| H01L 23/522 | (2006.01) |
| H01L 21/50 | (2006.01) |
| G06F 30/39 | (2020.01) |
| H01L 23/528 | (2006.01) |

(52) U.S. Cl.
CPC .......... *H01L 23/5226* (2013.01); *G06F 30/39* (2020.01); *H01L 21/50* (2013.01); *H01L 23/528* (2013.01)

(58) Field of Classification Search
CPC ............... H01L 23/5226; H01L 23/528; H01L 21/50; G06F 30/39
USPC ...................................................... 257/774
See application file for complete search history.

(56) References Cited

U.S. PATENT DOCUMENTS

| | | | |
|---|---|---|---|
| 7,611,991 B2 | 11/2009 | Richter et al. | |
| 7,615,708 B2 | 11/2009 | Hsu et al. | |
| 7,949,981 B2 | 5/2011 | Greco | |
| 8,242,593 B2 | 8/2012 | Kacker et al. | |
| 9,009,644 B1 | 4/2015 | Sharma et al. | |
| 9,779,989 B1 | 10/2017 | Huang et al. | |
| 10,211,168 B1* | 2/2019 | Chavali | H01L 21/76877 |
| 2006/0091423 A1* | 5/2006 | Poechmueller | H01L 29/4238 257/206 |
| 2014/0184263 A1* | 7/2014 | Ehrenpfordt | G01R 31/2884 324/762.03 |
| 2018/0228019 A1* | 8/2018 | Becker | G06F 30/20 |

FOREIGN PATENT DOCUMENTS

WO     2005/117115 A1    12/2005

* cited by examiner

*Primary Examiner* — Tu-Tu V Ho
(74) *Attorney, Agent, or Firm* — Shuqian Yan

(57) ABSTRACT

An integrated circuit includes functional structures and non-functional structures. The functional structures include one or more functional metal structures. The non-functional structures include one or more non-functional metal structures. At least one of the one or more non-functional metal structures is connected to at least one of the one or more functional metal structures. For example, the at least one non-functional metal structure is connected to the at least one functional metal structure through a via. Alternatively, the at least one non-functional metal structure is connected to the at least one functional metal structure by physically contacting the at least one functional metal structure without using a via.

11 Claims, 5 Drawing Sheets

INTEGRATED CIRCUIT WITH NON-FUNCTIONAL STRUCTURES

The present disclosure generally relates to integrated circuit (IC), and more particularly to security IC.

In the semiconductor industry, especially for very-large-scale integration (VLSI) integrated circuits, a via or VIA (also known as "vertical interconnect access") is an electrical connection between layers in a physical electronic circuit that goes through the plane of one or more adjacent layers. To increase manufacturability and yield and/or to fulfill certain electrical requirements, more than one via may be used to establish connections between different layers. The current state-of-the-art may also use dummy via structures and/or dummy metal structures (hereinafter also referred to as "non-functional structures") to fulfill any density rules of the manufacturing process to reduce manufacturing failures.

The increase in the number and complexity of applications in the market of security IC is reflected in the increase of the level of data security required. The security needs for a security IC can be summarized as being able to counter those who want to defraud, gain unauthorized access to data and control a system using a security IC. This requires that the security IC maintains the integrity and the confidentiality of its security functionality. The typical security IC is provided with measures to protect against attacks such as hacking and re-engineering. For example, the security IC may use both non-functional structures (i.e., dummy structures) and functional structures to make it more difficult to identify the functional structures. Investigations have shown that the capabilities of re-engineering setups are growing. These setups are used to partially or fully extract the functionality of ICs.

SUMMARY

An integrated circuit includes a plurality of functional structures and a plurality of non-functional structures. The plurality of functional structures includes one or more functional metal structures. The plurality of non-functional structures includes one or more non-functional metal structures. At least one of the one or more functional metal structures is connected to at least one of the one or more non-functional metal structures In one embodiment, at least one of the one or more functional metal structures is connected to at least one of the one or more non-functional metal structures includes the at least one functional metal structure is connected to the at least one non-functional metal structure by a via.

In one embodiment, at least one of the one or more functional metal structures is connected to at least one of the one or more non-functional metal structures includes the at least one functional metal structure is in physical contact with the at least one non-functional metal structure. In one embodiment, the at least one functional metal structure and the at least one non-functional metal structure are in a same layer.

In one embodiment, the one or more functional metal structures include a first functional metal structure and a second functional metal structure in a first layer, and a third functional metal structure in a second layer. The one or more non-functional metal structures include a first non-functional metal structure and a second non-functional metal structure in the first layer, and a third non-functional metal structure in the second layer.

In one embodiment, the first functional metal structure in the first layer is connected to the third non-functional metal structure in the second layer by a first via, the third functional metal structure in the second layer is connected to the first non-functional metal structure in the first layer by a second via, and the second functional metal structure in the first layer is in physical contact with the second non-functional metal structure in the first layer without using a via.

In one embodiment, the plurality of functional structures includes the first via and the second via.

In one embodiment, the plurality of non-functional structures includes the first via and the second via.

In one embodiment, the one or more functional metal structures include a fourth functional metal structure in the first layer and a fifth functional metal structure in the second layer. The fourth functional metal structure is connected to the fifth functional metal structure by a via.

In one embodiment, the integrated circuit is a security IC.

A method implemented for an integrated circuit that includes a plurality of functional structures having one or more functional metal structures, includes inserting a plurality of non-functional structures having one or more non-functional metal structures to the integrated circuit, and connecting at least one of the one or more functional metal structures to at least one of the one or more non-functional metal structures.

In one embodiment, connecting at least one of the one or more functional metal structures to at least one of the one or more non-functional metal structures includes connecting the at least one functional metal structure to the at least one non-functional metal structure by a via.

In one embodiment, connecting at least one of the one or more functional metal structures to at least one of the one or more non-functional metal structures includes causing the at least one non-functional metal structure to be in physical contact with the at least one functional metal structure.

In one embodiment, connecting at least one of the one or more functional metal structures to at least one of the one or more non-functional metal structures includes connecting a first functional metal structure in a first layer to a third non-functional metal structure in a second layer by a first via, connecting a third functional metal structure in the second layer to a first non-functional metal structure in the first layer by a second via, and connecting a second functional metal structure in the first layer to a second non-functional metal structure in the first layer by causing a physical contact between the second functional metal structure and the second non-functional metal structure without using a via.

In one embodiment, the method further includes connecting a functional metal structure in a first layer to another functional metal structure in a second layer by a via.

The above discussion is not intended to represent every example embodiment or every implementation within the scope of the current or future Claim sets.

Various example embodiments may be more completely understood in consideration of the following Detailed Description in connection with the accompanying Drawings.

Figure 1:
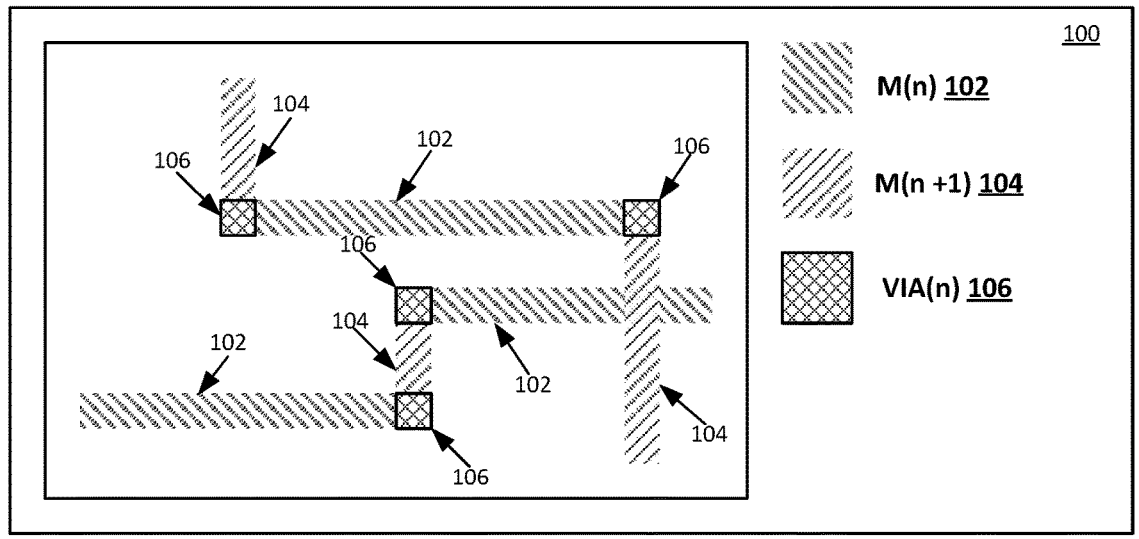
FIG. 1 is a simplified view depicting vias that are used to establish connections between different metal levels.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

FIG. 1 is a simplified view depicting a plurality of vias 106 that are used to establish connections between different levels of metal layers. For the sake of simplicity only two metal layers are shown in the figure, in which M(n) 102 denotes one or more structures in metal layer n, and M(n+1) 104 denotes one or more structures in metal layer n+1.

Figure 2:
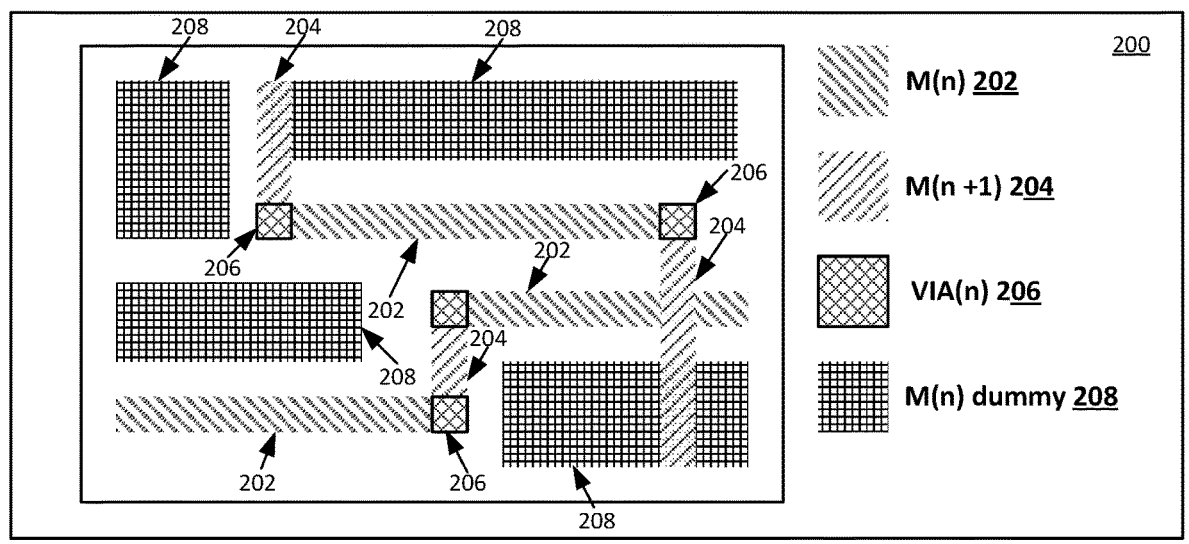
FIG. 2 depicts an example of dummy metal structures that are added to satisfy processing requirements.

FIG. 2 depicts an example of dummy metal structures 208 that are added to satisfy processing requirements. For the sake of simplicity only dummy metal structures 208 in layer n are shown in the figure.

Figure 3:
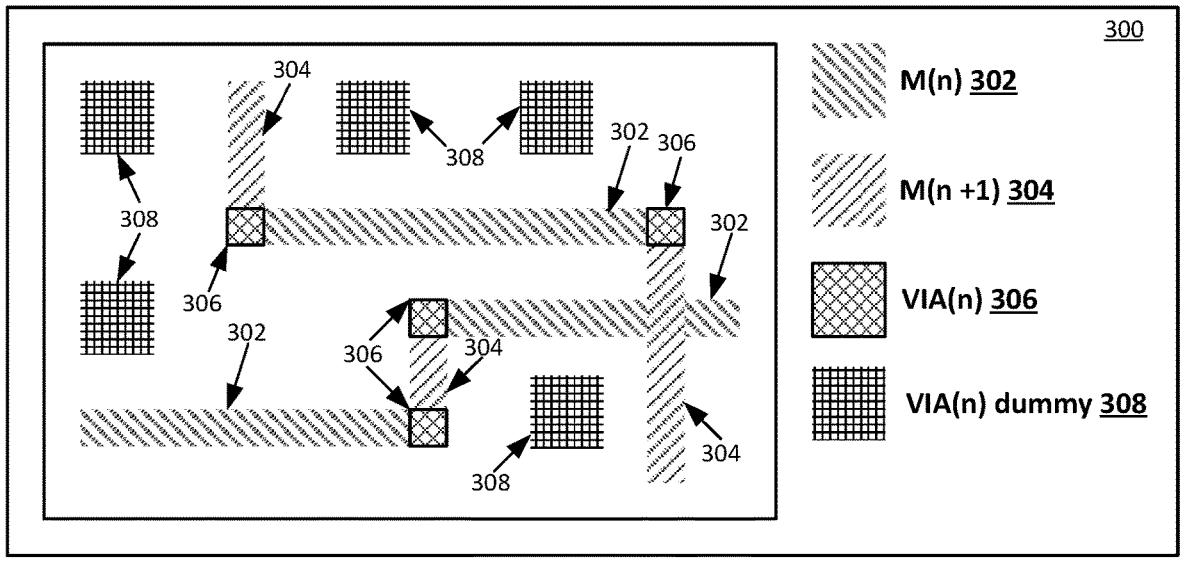
FIG. 3 depicts an example of dummy via structures that are added to satisfy processing requirements.

FIG. 3 shows an example of dummy via structures 308 that are added to satisfy processing requirements. For the sake of simplicity only dummy via structures 308 are shown. Depending on the process rules, dummy via structures 308 may be underlaid with M(n) 302 and covered by M(n+1) 304.

The examples shown in FIG. 2 and FIG. 3 illustrate that dummy metal structures (208) or dummy via structures (308) can be added in low density regions of an IC to satisfy processing requirements. These dummy structures (hereinafter referred to as "non-functional structures") can be easily distinguished from functional structures. For example, functional structures as depicted in FIG. 2 include M(n) 202, M(n+1) 204, and VIA(n) 206, and functional structures as depicted in FIG. 3 include M(n) 302, M(n+1) 304, and VIA(n) 306.

Figure 4:
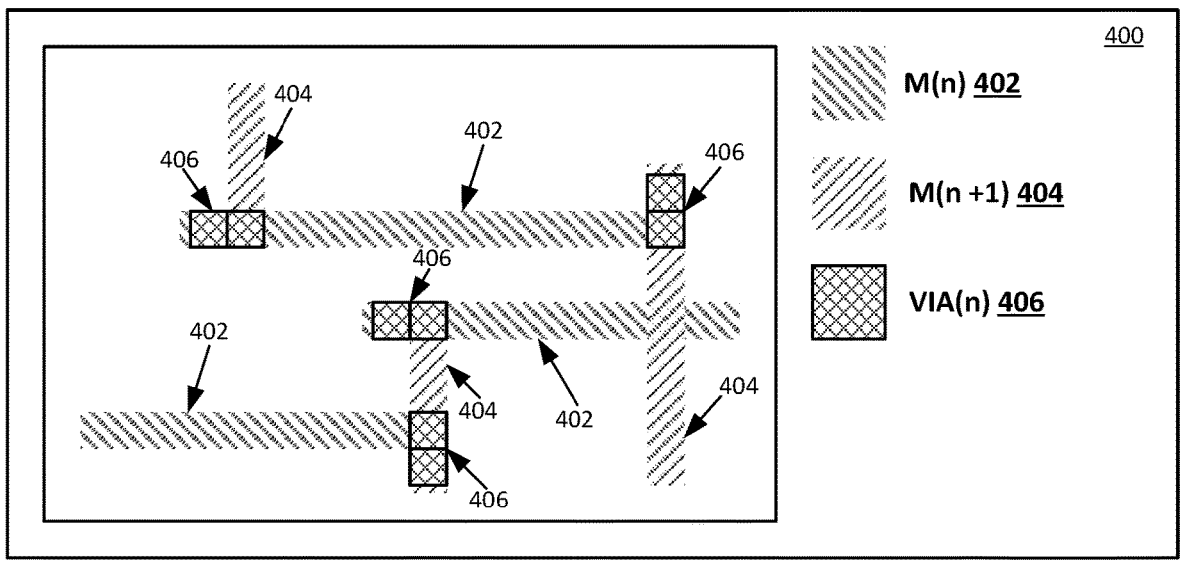
FIG. 4 depicts an example of additional vias that are added to improve the manufacturability of the connection.

FIG. 4 shows an example of additional vias 406 that are added to the IC to improve the manufacturability of the connections. For the sake of simplicity only two metal layers n and n+1 are shown in the figure.

Figure 5:
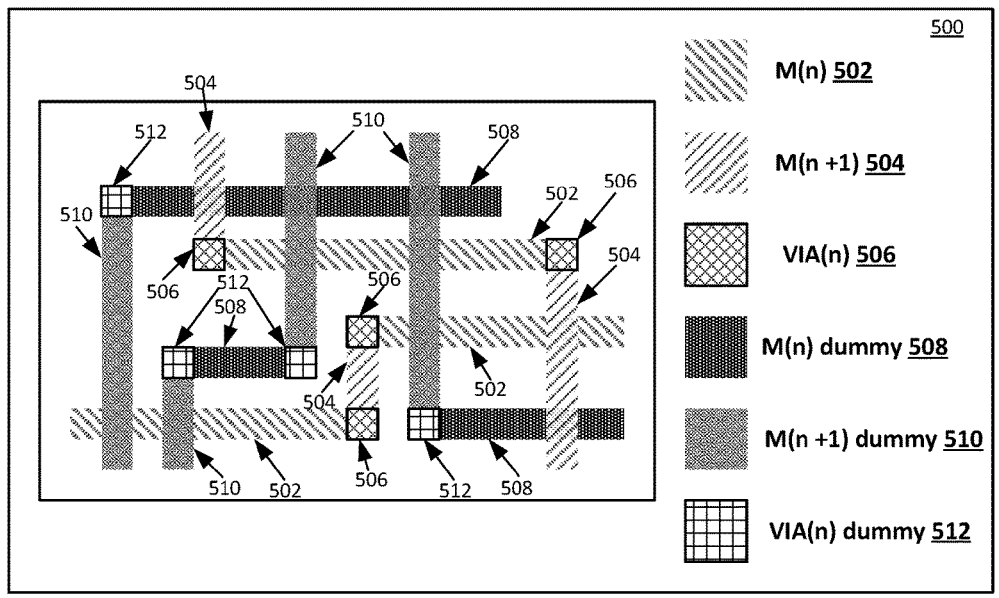
FIG. 5 depicts an example of non-functional or dummy structures mixed with functional structures for the purposes of obfuscation.

FIG. 5 shows an example of non-functional or dummy structures mixed with functional structures for the purposes of obfuscation. As depicted in FIG. 5, functional structures include M(n) 502, M(n+1) 504, and VIA(n) 506, and non-functional or dummy structures include M(n) dummy 508, M(n+1) dummy 510, and VIA(n) dummy 512. Here, the non-functional metal structures (M(n) dummy 508, M(n+1) dummy 510) are not connected to the functional metal structures (M(n) 502, M(n+1) 504). For example, M(n) 502 (denoting functional metal structures in layer n) is not connected to M(n) dummy 508 (denoting non-functional or dummy metal structures in layer n) or M(n+1) dummy 510 (denoting non-functional or dummy metal structures in layer n+1). Similarly, M(n+1) 504 (denoting functional metal structures in layer n+1) is not connected to M(n) dummy 508 or M(n+1) dummy 510. Thus, the non-functional structures are simply mixed with the functional structures for the purposes of obfuscation. The non-functional metal structures are not connected to the functional metal structures as illustrated in FIG. 5.

Figure 6:
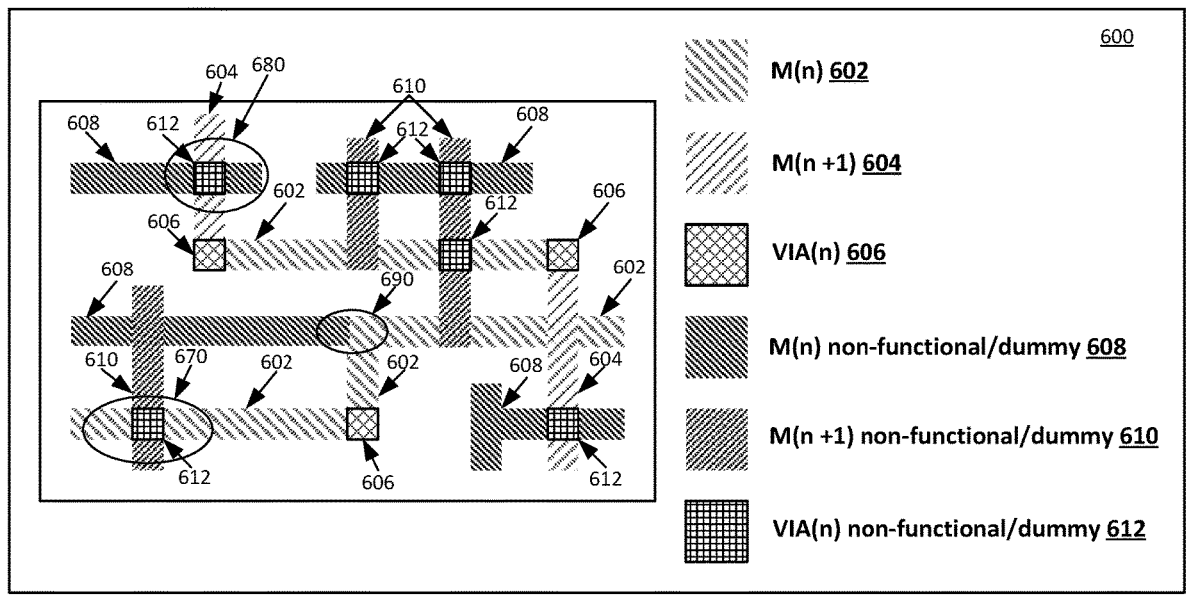
FIG. 6 depicts an example of non-functional structures that are added and connected to the functional structures of an IC.

FIG. 6 shows an example of non-functional structures that are being added and connected to the functional structures of an IC. For the sake of simplicity, the example is limited to two metal layers.

As depicted in FIG. 6, functional structures include M(n) 602, M(n+1) 604, and VIA(n) 606, and non-functional or dummy structures include M(n) dummy 608, M(n+1) dummy 610, and VIA(n) dummy 612. Here, the non-functional or dummy metal structures (M(n) dummy 608, M(n+1) dummy 610) not only are added to the IC but are also connected to the functional metal structures (M(n) 602, M(n+1) 604) as described below.

As depicted in FIG. 6, oval box 670 illustrates that M(n) 602 (denoting one or more functional metal structures in layer n) is connected to M(n+1) dummy 610 (denoting one or more non-functional or dummy metal structures in layer n+1) through VIA(n) dummy 612. In another example, oval box 680 illustrates that M(n+1) 604 (denoting one or more functional metal structures in layer n+1) is connected to M(n) dummy 608 (denoting one or more non-functional or dummy metal structures in layer n) through VIA(n) dummy 612. These two examples illustrate that a non-functional or dummy metal structure (e.g., M(n) dummy 608, M(n+1) dummy 610) can be connected to a functional metal structure (e.g., M(n) 602, M(n+1) 604) through a via (a dummy via or a functional via).

In addition, the connection between a functional metal structure (M(n) 602 or M(n+1) 604) and a non-functional or dummy metal structure (M(n) dummy 608 or M(n+1) dummy 610) can also be done by extending the non-functional structure so that it is in physical contact with the functional structure. For example, as shown in FIG. 6, oval box 690 illustrates that a functional metal structure in layer n (e.g., M(n) 602) and a dummy metal structure also in layer n (e.g., M(n) dummy 608) are connected to each other by extending the non-functional metal structure (M(n) dummy 608) until it is in physical contact with the functional metal structure (M(n) 602). The same can also be done for other layers such as layer n+1 (not shown).

In one embodiment, the dimensions of the non-functional structures in FIG. 6 may match the dimensions of the functional structures to achieve strong obfuscation effects. Though this is not necessary, it is beneficial since the non-functional structures having the same dimensions as the dimensions of the functional structures can be easily confused with the functional structures. Additionally, the number of non-functional structures that may be added to the IC can also be maximized.

Recall that FIG. 2 and FIG. 3 illustrate examples of dummy structures that are added in low density regions of an IC to satisfy processing requirements. In one embodiment, the protection and yield measures as discussed in FIG. 2 and FIG. 3 can be implemented for the example illustrated in FIG. 6.

The example illustrated in FIG. 6 makes uses of free IC resources and therefore it does not increase the area and cost of an IC as long as there is no guaranteed minimum number of structures required. However, additional IC area may be needed to achieve some targeted results. For example, additional IC space may be reserved for non-functional structures to make sure that the number of non-functional structures reaches a certain limit or to ensure that specific nets are guaranteed to be combined with the non-functional structures.

Figure 7:
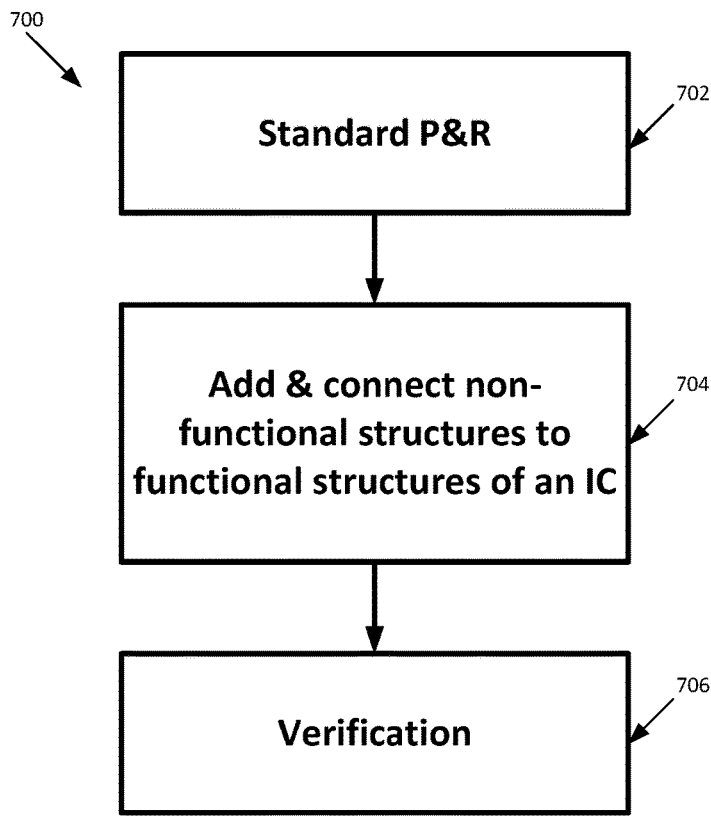
FIG. 7 is a flow diagram illustrating a method that may be implemented for the example described in FIG. 6.

FIG. 7 is a flow diagram illustrating a method that may be implemented for the example described in FIG. 6.

At 702, standard placement and route are performed. Standard P&R is well-known in the relevant art and thus will not be explained in further details.

At 704, non-functional or dummy structures are inserted or added to the IC and connected to functional structures in the IC. For example, as shown in FIG. 6, M(n) 602 (denoting one or more functional metal structures in layer n) is connected to M(n+1) dummy 610 (denoting one or more non-functional or dummy metal structures in layer n+1) through a via (e.g., VIA(n) dummy 612). Similarly, M(n+1) 604 (denoting one or more functional metal structures in layer n+1) is connected to M(n) dummy 608 (denoting one or more non-functional or dummy metal structures in layer n) through a via (e.g., VIA(n) dummy 612). In yet another example as shown in FIG. 6, M(n) 602 can also be connected to M(n) dummy 608 by extending M(n) dummy 608 until it is in physical contact with M(n) 602 (as they are in the same layer). The same can also be done for all other layers.

At 706, design verification is performed. Design verification is well-known in the relevant art and thus will not be explained in further details. The verification step at 706 ensures that the result fulfills all the relevant design and process requirements.

Method 700 may include other steps to fulfill any process requirements and/or any other additional constraints. For example, additional dummy structures may be added in low density regions of the IC to satisfy certain processing requirements.

Method 700 extends the standard placement and route flow by inserting non-functional or dummy structures to the IC and connecting the non-functional structures to the functional structures of the IC. As such, this increases the error rate and necessary effort for reverse engineering.

Figure 8:
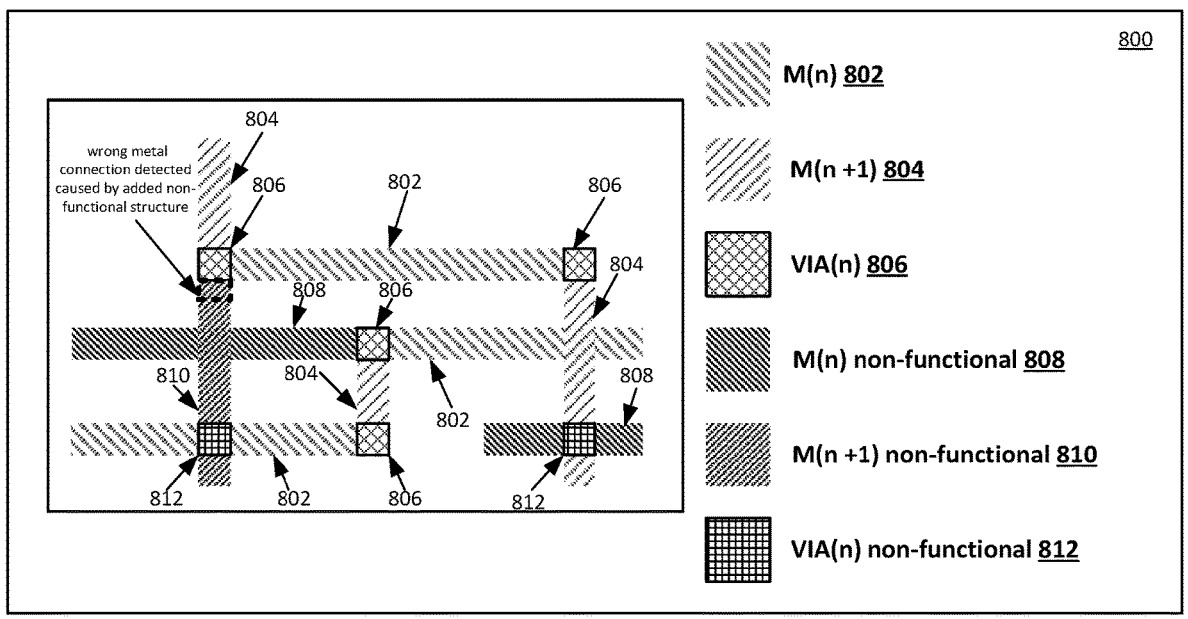
FIG. 8 depicts an example of detecting a wrong metal connection during reverse engineering caused by the added non-functional structures.

FIG. 8 shows an example of a wrong metal connection detected during reverse engineering caused by the added non-functional structures. This results in invalid data produced in the reverse engineering process.

Figure 9:
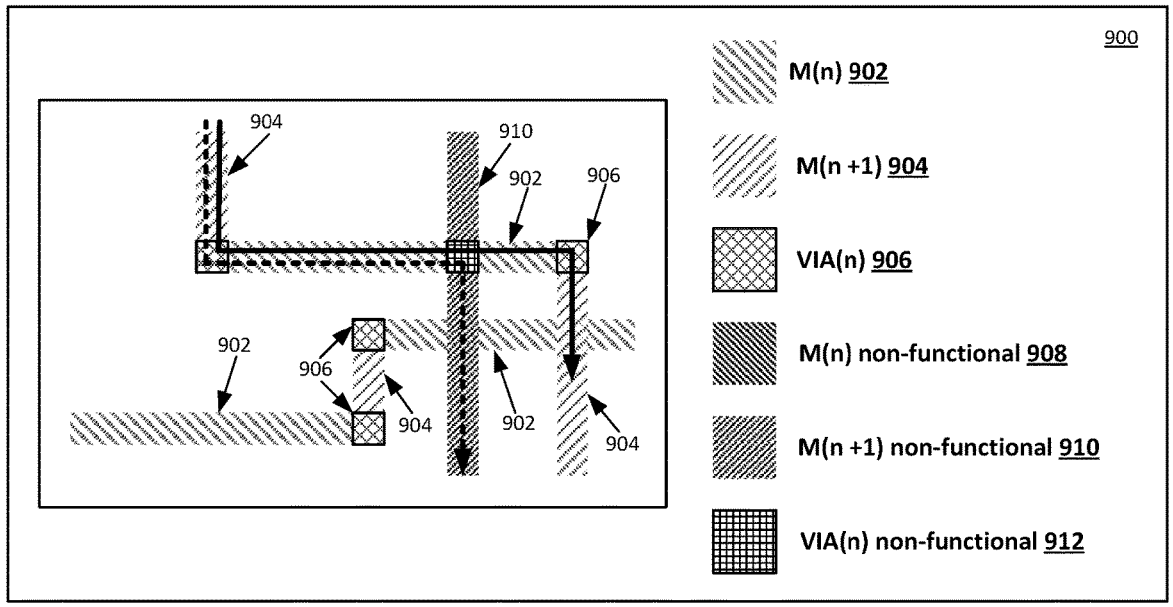
FIG. 9 depicts an example of a wrong ending connection detected during reverse engineering caused by the added non-functional structures.

FIG. 9 shows an example of a wrong ending connection detected during reverse engineering caused by the added non-functional structures. This is caused by a wrong assumption that the correct path follows the non-functional structure. As depicted in FIG. 9, the dotted line indicates an incorrect path caused by the added non-functional structure resulting in wrong ending connection being detected during the reverse engineering.

Figure 10:
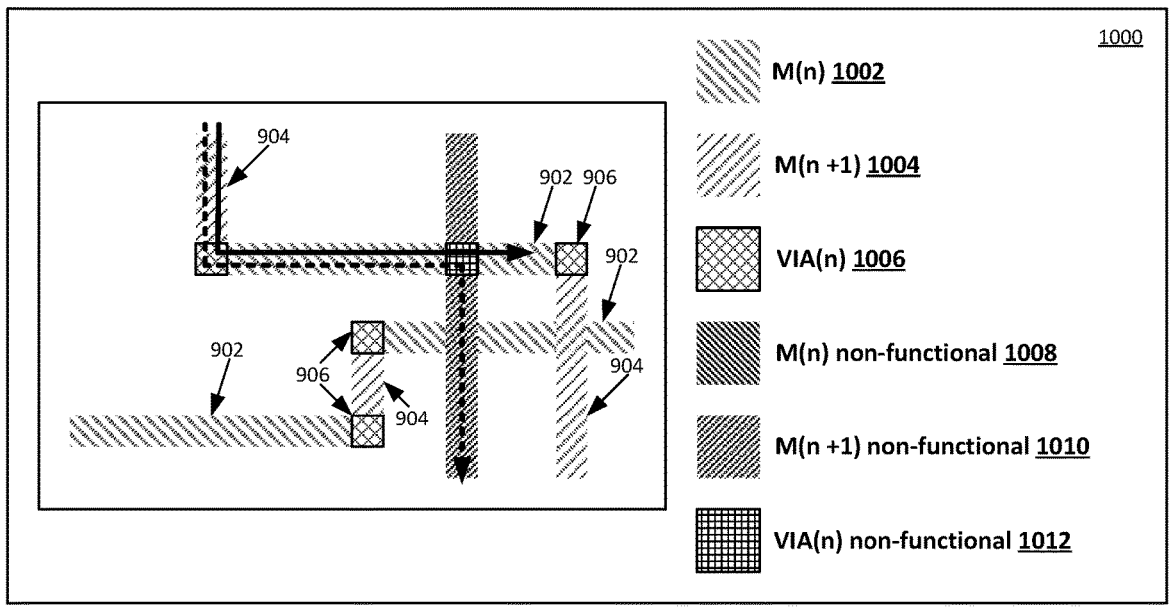
FIG. 10 depicts an example of a wrong connection detected during reverse engineering.

FIG. 10 shows an example of a wrong connection detected during reverse engineering. This is because the correct path via the functional via (shown in solid arrow line) was rejected during the reverse engineering. As depicted in FIG. 9, the dotted line indicates an incorrect path caused by the added non-functional structure resulting in wrong connection being detected during the reverse engineering.

It should be noted that the above-mentioned embodiments illustrate rather than limit the invention, and that those skilled in the art will be able to design many alternative embodiments without departing from the scope of the appended claims. It is intended that the following claims cover all possible example embodiments.

In the claims, any reference signs placed between parentheses shall not be construed as limiting the claim. The word "comprising" does not exclude the presence of elements or steps other than those listed in a claim. The indefinite article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. An integrated circuit comprising:
   one or more functional metal structures; and
   one or more non-functional metal structures;
   wherein at least one of the one or more functional metal structures is connected to at least one of the one or more non-functional metal structures;
   wherein at least one of the one or more functional metal structures is connected to at least one of the one or more non-functional metal structures includes at least one functional metal structure being in physical contact with at least one non-functional metal structure, wherein the at least one functional metal structure and the at least one non-functional metal structure are in a same metal layer.

2. The integrated circuit of claim 1,
   wherein at least one of the one or more functional metal structures is connected to at least one of the one or more non-functional metal structures includes at least one functional metal structure in a first metal layer being connected to at least one non-functional metal structure in a second metal layer by a first via.

3. The integrated circuit of claim 2,
   wherein at least one of the one or more functional metal structures is connected to at least one of the one or more non-functional metal structures includes at least one functional metal structure in the second metal layer being connected to at least one non-functional metal structure in the first metal layer by a second via.

4. The integrated circuit of claim 2, wherein the first via is either a functional structure or a non-functional structure.

5. The integrated circuit of claim 3, wherein the second via is either a functional structure or a non-functional structure.

6. The integrated circuit of claim 1,
   wherein at least one of the one or more functional metal structures is connected to at least one of the one or more non-functional metal structures includes
   at least one functional metal structure in a first metal layer being connected to at least one functional metal structure in a second metal layer by a via.

7. The integrated circuit of claim 1, wherein the integrated circuit is a security IC.

8. A method implemented for an integrated circuit having one or more functional metal structures, comprising:
   providing one or more non-functional metal structures; and
   connecting at least one non-functional metal structure to be in physical contact with at least one functional metal structure in a same metal layer without using a via.

9. The method of claim 8,
further comprising connecting a functional metal structure in a first metal layer to a non-functional metal structure in a second metal layer by a first via.

10. The method of claim 8, further comprising connecting a functional metal structure in a first metal layer to another functional metal structure in a second metal layer by a via.

11. The method of claim 9, further comprising connecting a functional metal structure in the second metal layer to a non-functional metal structure in the first metal layer by a second via.

* * * * *